US006914498B2

(12) United States Patent
Kadota

(10) Patent No.: US 6,914,498 B2
(45) Date of Patent: *Jul. 5, 2005

(54) SURFACE ACOUSTIC WAVE DEVICE ON LITAO$_3$ SUBSTRATE USING PRIMARILY SILVER ELECTRODES COVERED WITH SIO$_2$ FILM

(75) Inventor: Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 53 days.

This patent is subject to a terminal disclaimer.

(21) Appl. No.: 10/345,961

(22) Filed: Jan. 17, 2003

(65) Prior Publication Data

US 2003/0137367 A1 Jul. 24, 2003

(30) Foreign Application Priority Data

Jan. 18, 2002 (JP) ........................................ 2002-010301

(51) Int. Cl.$^7$ .......................... H03H 9/64; H03H 9/145; H03H 9/25
(52) U.S. Cl. .................................... 333/195; 310/313 A
(58) Field of Search ............................... 333/193–196, 333/133; 310/313 A

(56) References Cited

U.S. PATENT DOCUMENTS

| | | | | |
|---|---|---|---|---|
| 4,978,879 A | * | 12/1990 | Satoh et al. | 310/313 A |
| 5,453,652 A | * | 9/1995 | Eda et al. | 310/313 R |
| 5,729,186 A | * | 3/1998 | Seki et al. | 333/194 |
| 5,844,347 A | * | 12/1998 | Takayama et al. | 310/313 R |
| 6,037,847 A | * | 3/2000 | Ueda et al. | 333/193 |
| 6,317,015 B1 | * | 11/2001 | Ueda et al. | 333/193 |
| 6,366,002 B1 | * | 4/2002 | Kadota | 310/313 A |
| 6,522,219 B2 | * | 2/2003 | Takamiya et al. | 333/133 |

FOREIGN PATENT DOCUMENTS

| | | | | |
|---|---|---|---|---|
| EP | 0 734 120 A1 | * | 9/1996 | |
| EP | 0 734 120 B1 | | 4/2000 | |
| JP | 61-136312 | | 6/1986 | |
| JP | 2-37815 | * | 2/1990 | |
| JP | 02-295212 | | 12/1990 | |
| JP | 4-258008 | * | 9/1992 | |
| JP | 06-164306 | | 6/1994 | |
| JP | 6-164306 | * | 6/1994 | 310/313 A |
| JP | 7-212176 | * | 8/1995 | |
| JP | 9-186542 | * | 7/1997 | |
| JP | 11-186866 | | 7/1999 | |
| JP | 2001-77662 | * | 3/2001 | 415/209.1 |
| KR | 0185517 | | 12/1998 | |
| KR | 2000-0077264 | | 12/2000 | |

OTHER PUBLICATIONS

AP James J. Campbell et al., "A Method for Estimating Optimal Crystal Cuts and Propagation Directions for Excitation of Piezoelectric Surface Waves", IEEE Transactions on Sonics and Ultrasonics, vol. SU–15, No. 4, Oct. 1968, pp. 209–217.

AR O. Kawachi et al., "Optimum Cut of LiTaO$_3$ for High Performance Leaky Surface Acoustic Wave Filters", 1996 IEEE Ultrasonics Symposium, pp. 71–76.

* cited by examiner

*Primary Examiner*—Barbara Summons
(74) *Attorney, Agent, or Firm*—Keating & Bennett, LLP

(57) ABSTRACT

A surface acoustic wave device has a significantly improved frequency temperature characteristic due to the arrangement of a SiO$_2$ film on an IDT such that cracking in the SiO$_2$ film surface is prevented from occurring, desired characteristics are reliably achieved, the electromechanical coupling coefficients is increased, and the attenuation constant α is reduced. In the surface acoustic wave device, at least one IDT primarily including Ag is arranged on a 20° to 60°-rotated Y plate LiTaO$_3$ substrate, and the SiO$_2$ film is arranged on the LiTaO$_3$ substrate while covering the IDT.

40 Claims, 16 Drawing Sheets

BEFORE FILM FORMATION

Al/LT

AFTER FILM FORMATION

CRACK $SiO_2$/Al/LT

SURFACE ACOUSTIC WAVE DEVICE ON LITAO₃ SUBSTRATE USING PRIMARILY SILVER ELECTRODES COVERED WITH SIO₂ FILM

BACKGROUND OF THE INVENTION

1. Field of the Invention

The present invention relates to a surface acoustic wave device for use, for example, as a resonator, band-pass filter, or other suitable device. In particular, the present invention relates to a surface acoustic wave device using a rotated Y plate X-propagating $LiTaO_3$ substrate and a method for manufacturing the same.

2. Description of the Related Art

In mobile communication apparatuses, for example, cellular phones, surface acoustic wave filters have been used as RF stage band-pass filters and duplexers. As this sort of surface acoustic wave filter, the surface acoustic wave filter using a leaky surface acoustic wave has been in actual use, in which an IDT (interdigital transducer) made of Al is arranged on a 30° to 50°-rotated Y plate X-propagating $LiTaO_3$ substrate.

However, this surface acoustic wave filter has a poor frequency temperature characteristic of −30 ppm/° C. to −40 ppm/° C. and, therefore, improvements thereto have been required. In order to improve the frequency temperature characteristic, a structure has been suggested, in which an IDT made of Al has been disposed on the 30° to 50'-rotated Y plate X-propagating $LiTaO_3$ substrate and, thereafter, a $SiO_2$ film has been further laminated thereon. The frequency temperature characteristic is improved by arrangement of the $SiO_2$ film.

When the IDT made of Al is formed, the electrode film thickness H/λ (H denotes a film thickness and λ denotes a wavelength of a surface acoustic wave) of the IDT is significantly increased to 0.08 to 0.10 in order to increase the reflection coefficient and electromechanical coupling coefficient $K^2$. Since the IDT made of Al was allowed to have a significant thickness as described above, regarding the portion shown in FIG. 16A, when the $SiO_2$ film was formed thereon in order to improve the frequency temperature characteristic, large height differences occurred in the $SiO_2$ film and, thereby, cracks sometimes occurred in the $SiO_2$ film as shown in FIG. 16B. Consequently, the filter characteristics of the surface acoustic wave filter were likely to degrade due to occurrence of the cracks.

In addition, since the electrode film thickness of the IDT made of Al is large, an effect of covering the disparities (concavity and convexity) on the electrode surface of the IDT based on the arrangement of the $SiO_2$ film was not adequate and, thereby, the temperature characteristic was not always improved adequately.

Furthermore, the attenuation constant was increased due to the arrangement of the $SiO_2$ film and, thereby, degradation of the filter characteristics occurred.

SUMMARY OF THE INVENTION

In order to overcome the problems described above, preferred embodiments of the present invention provide a surface acoustic wave device and a method for manufacturing the same, the surface acoustic wave device includes a rotated Y plate X-propagating $LiTaO_3$ substrate and has a significantly improved frequency temperature characteristic due to the arrangement of the $SiO_2$ film and, in addition to this, the electrode film thickness of the IDT is greatly reduced, cracking in the $SiO_2$ film is reliably prevented and, furthermore, the attenuation constant is reduced by a large degree, so that targeted electrical characteristics, for example, filter characteristics, can be achieved, and the electromechanical coupling coefficient and reflection coefficient in the IDT achieve desired values.

According to a preferred embodiment of the present invention, a surface acoustic wave device includes a $LiTaO_3$ substrate having Euler angles (0±3°, 110° to 150°, 0±3°), at least one IDT which is arranged on the $LiTaO_3$ substrate and which primarily includes Ag, and a $SiO_2$ film arranged on the $LiTaO_3$ substrate to cover the IDT.

In preferred embodiments of the present invention, since the IDT primarily includes Cu, and the $SiO_2$ film is provided, the electromechanical coupling coefficient is increased, and the frequency temperature characteristic is improved. Furthermore, since the $LiTaO_3$ substrate having the specific Euler angles is used, the attenuation constant α is greatly reduced.

In a preferred embodiment of the present invention, preferably, the film thickness H/λ (H represents a film thickness and λ represents a wavelength of a surface acoustic wave) of the IDT normalized by the wavelength of the surface acoustic wave is within the range of about 0.01 to about 0.08, and the film thickness H/λ of the $SiO_2$ film normalized by the wavelength of the surface acoustic wave is within the range of about 0.15 to about 0.40. In that case, according to preferred embodiments of the present invention, a surface acoustic wave device which has a large electromechanical coupling coefficient and reflection coefficient, excellent frequency temperature characteristic, and adequately reduced attenuation constant a and in which cracking in the $SiO_2$ film are prevented from occurring can be provided with reliability.

In another preferred embodiment of the present invention, preferably, the film thickness H/λ of the IDT is about 0.12 or less, and the combination of the normalized film thickness of the $SiO_2$ and the Euler angles of the $LiTaO_3$ substrate is specified to be any one of those indicated by (a) to (f) in the following Table 1.

TABLE 1

| | $SiO_2$ film thickness | Euler angles of $LiTaO_3$ | More preferable Euler angles |
|---|---|---|---|
| (a) | 0.15 to 0.18 | 0 ± 3, 117 to 137, 0 ± 3 | 0 ± 3, 120 to 135, 0 ± 3 |
| (b) | 0.18 to 0.23 | 0 ± 3, 117 to 136, 0 ± 3 | 0 ± 3, 118 to 133, 0 ± 3 |
| (c) | 0.23 to 0.28 | 0 ± 3, 115 to 135, 0 ± 3 | 0 ± 3, 117 to 133, 0 ± 3 |
| (d) | 0.28 to 0.33 | 0 ± 3, 113 to 133, 0 ± 3 | 0 ± 3, 115 to 132, 0 ± 3 |
| (e) | 0.33 to 0.38 | 0 ± 3, 113 to 135, 0 ± 3 | 0 ± 3, 115 to 133, 0 ± 3 |
| (f) | 0.38 to 0.40 | 0 ± 3, 113 to 132, 0 ± 3 | 0 ± 3, 115 to 130, 0 ± 3 |

In the surface acoustic wave device according to preferred embodiments of the present invention, preferably, a leaky surface acoustic wave is preferably used as the surface acoustic wave. According to preferred embodiments of the present invention, a surface acoustic wave device having an excellent frequency temperature characteristic, an IDT with a large electromechanical coupling coefficient and a reflection coefficient, and a small propagation loss can be provided.

Other features, elements, characteristics and advantages of the present invention will be more apparent from the following detailed description of preferred embodiments of the present invention with reference to the attached drawings.

BRIEF DESCRIPTION OF THE DRAWINGS

FIG. 16A shows the condition before formation of a $SiO_2$ film, and FIG. 16B shows the surface condition of the $SiO_2$ film after formation of the $SiO_2$ film.

DETAILED DESCRIPTION OF PREFERRED EMBODIMENTS

The present invention will be made clear by describing specific preferred embodiments of the present invention below with reference to the drawings.

Figure 1:
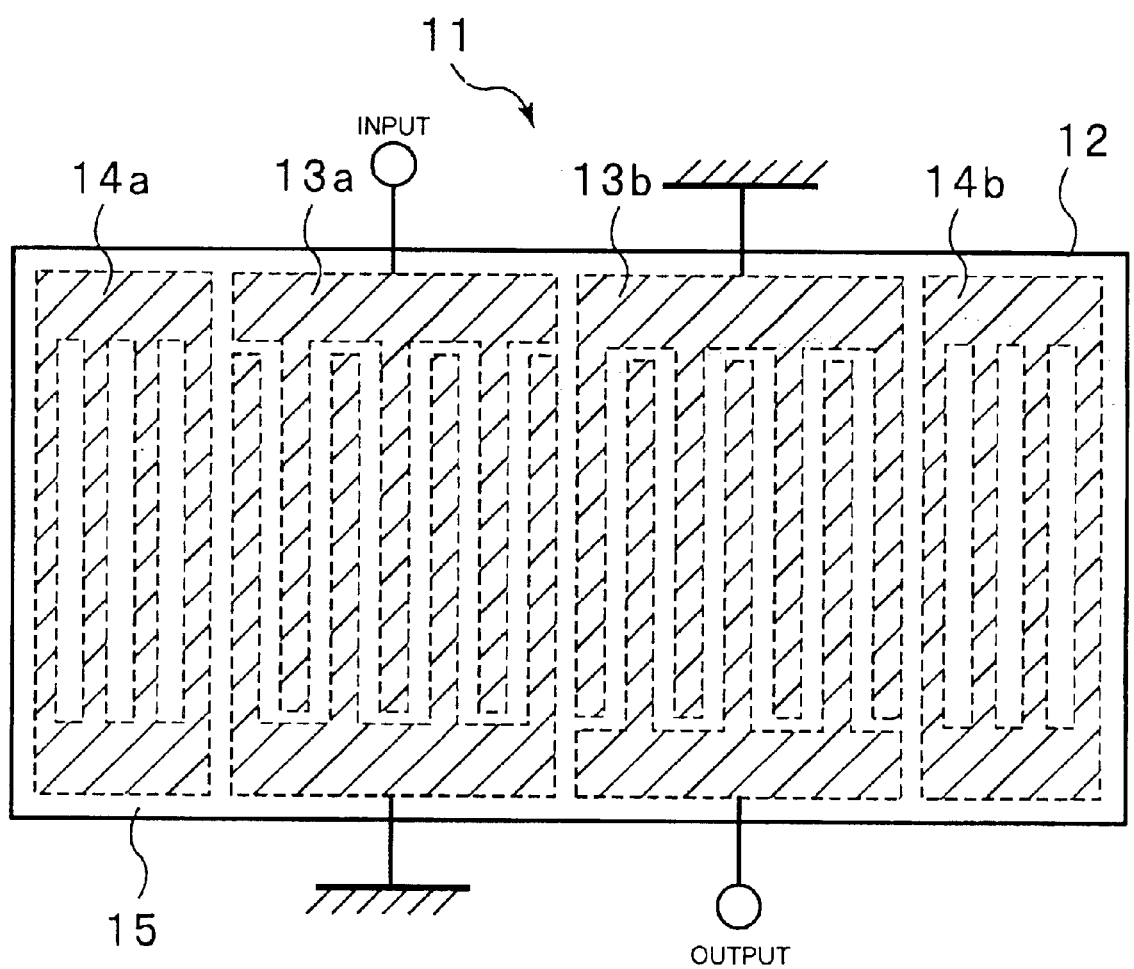
FIG. 1 is a plan view showing a surface acoustic wave device according to a preferred embodiment of the present invention.

FIG. 1 is a plan view for explaining a longitudinally coupled resonator filter as a surface acoustic wave device according to a preferred embodiment of the present invention.

A surface acoustic wave device 11 has a structure in which IDTs 13a and 13b and reflectors 14a and 14b are arranged on the top surface of a $LiTaO_3$ substrate 12. A $SiO_2$ film 15 is arranged while covering the IDTs 13a and 13b and reflectors 14a and 14b. As the $LiTaO_3$ substrate 12, a 20° to 60°-rotated Y plate $LiTaO_3$ substrate is preferably used. Regarding rotated Y plate X-propagating $LiTaO_3$ substrates having cut angles outside this range, attenuation constants are increased and TCFs are degraded.

The IDTs 13a and 13b and reflectors 14a and 14b are made of Ag having a density higher than that of Al.

Since the IDTs 13a and 13b and reflectors 14a and 14b are made of Ag having a density higher than that of Al as described above, even when the film thicknesses of the IDTs 13a and 13b and reflectors 14a and 14b are reduced compared with those in the case where Al is used, the electromechanical coupling coefficient and the reflection coefficient can be increased.

Since the electrode film thickness can be reduced as described above, occurrence of cracks due to the height differences of the $SiO_2$ film 15 arranged on the IDTs 13a and 13b can be reliably prevented. Regarding the thickness of the $SiO_2$ film 15, as is clear from experimental examples described later, the film thickness H/λ normalized by the wavelength of the surface acoustic wave is preferably within the range of about 0.15 to about 0.40. When the film thickness falls within this range, the attenuation constant can be decreased by a large degree compared with that in the case where the $SiO_2$ film is not arranged and, therefore, reduction of loss can be achieved.

As described later, the film thicknesses H/λ of the IDTs 13a and 13b normalized by the wavelength of the surface acoustic wave are preferably about 0.01 to about 0.08.

In the surface acoustic wave device according to preferred embodiments of the present invention, as described above, since the IDTs 13a and 13b include Ag on the LiTaO$_3$ substrate 12, the electrode film thicknesses of the IDTs 13a and 13b can be decreased. Consequently, occurrence of height differences in the SiO$_2$ film can be prevented, and cracking can be prevented with reliability. Furthermore, since the LiTaO$_3$ substrate having specific Euler angles is used, the attenuation constant can be reduced by a large degree, and reduction of loss can be achieved. In addition, excellent frequency temperature characteristic can be realized by arrangement of the SiO$_2$ film 15. This will be described based on the specific experimental examples.

Surface acoustic waves which propagate through the LiTaO$_3$ substrate preferably includes a leaky surface acoustic wave (LSAW) other than a Rayleigh wave. The leaky surface acoustic wave has a large sound velocity and a large electromechanical coupling coefficient compared with those of the Rayleigh wave, and propagates while releasing energy in the substrate. Consequently, the leaky surface acoustic wave has an attenuation constant which causes propagation loss.

Figure 3:
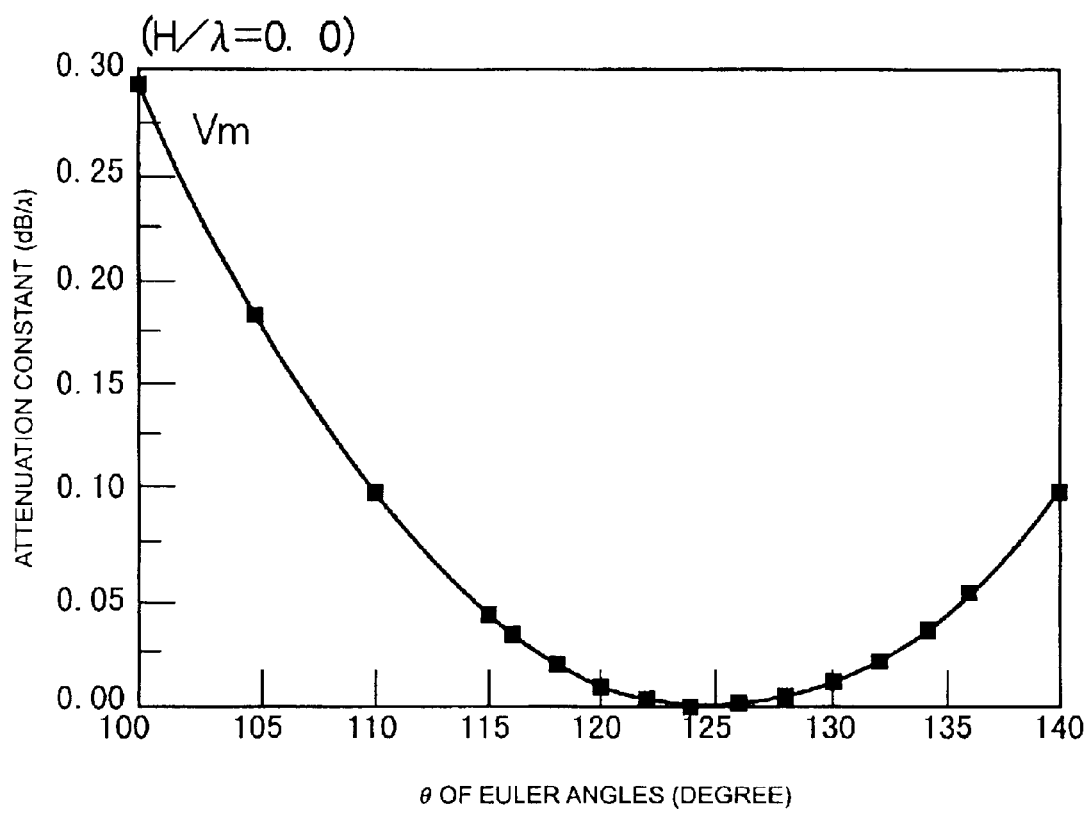
FIG. 3 is a diagram showing the relationship between the θ and the attenuation constant α on the $LiTaO_3$ substrate having Euler angles (0°, θ, 0°) when the film thickness of an electrode is 0.

FIG. 3 shows the relationship between the θ of the Euler angles (0°, θ, 0°) and the attenuation constant α when the substrate surface is electrically short-circuited regarding the rotated Y plate X-propagating LiTaO$_3$ substrate. There is a relationship that rotation angle=θ−90°.

As is clear from FIG. 3, the attenuation constant α is small when the θ of the Euler angles is within the range of about 124° to about 126°, and the attenuation constant α is increased outside this range. It is known that in the case where an IDT made of Al having relatively large thickness is used, the attenuation constant becomes small when the θ is about 129° to about 136°. Therefore, conventionally, when the IDT made of Al was used, a LiTaO$_3$ substrate in which the θ of the Euler angles was within the range of about 129° to about 136° was used.

Figure 2:
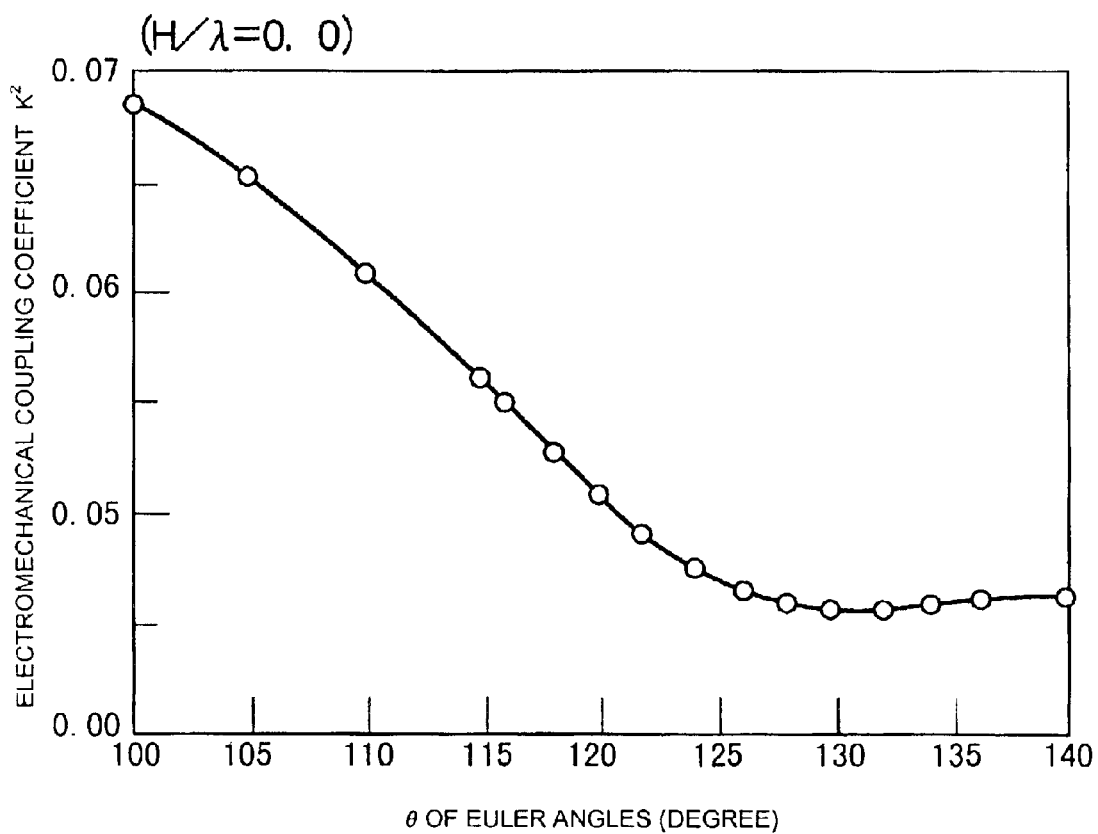
FIG. 2 is a diagram showing the relationship between the θ and the electromechanical coupling coefficient $K^2$ on the $LiTaO_3$ substrate having Euler angles (0°, θ, 0°) when the film thickness of an electrode is 0.

FIG. 2 shows the relationship between the θ of the Euler angles and the electromechanical coupling coefficient K$^2$. As is clear from FIG. 2, a large electromechanical coupling coefficient K$^2$ can be achieved when the θ of the Euler angles is within the range of about 100° to about 120°. However, as is clear from FIG. 3, since the attenuation constant α is large when the θ is within the range of about 100° to about 120°, the LiTaO$_3$ substrate having a θ of about 100° to about 120° cannot be used for the surface acoustic wave device.

Figure 4:
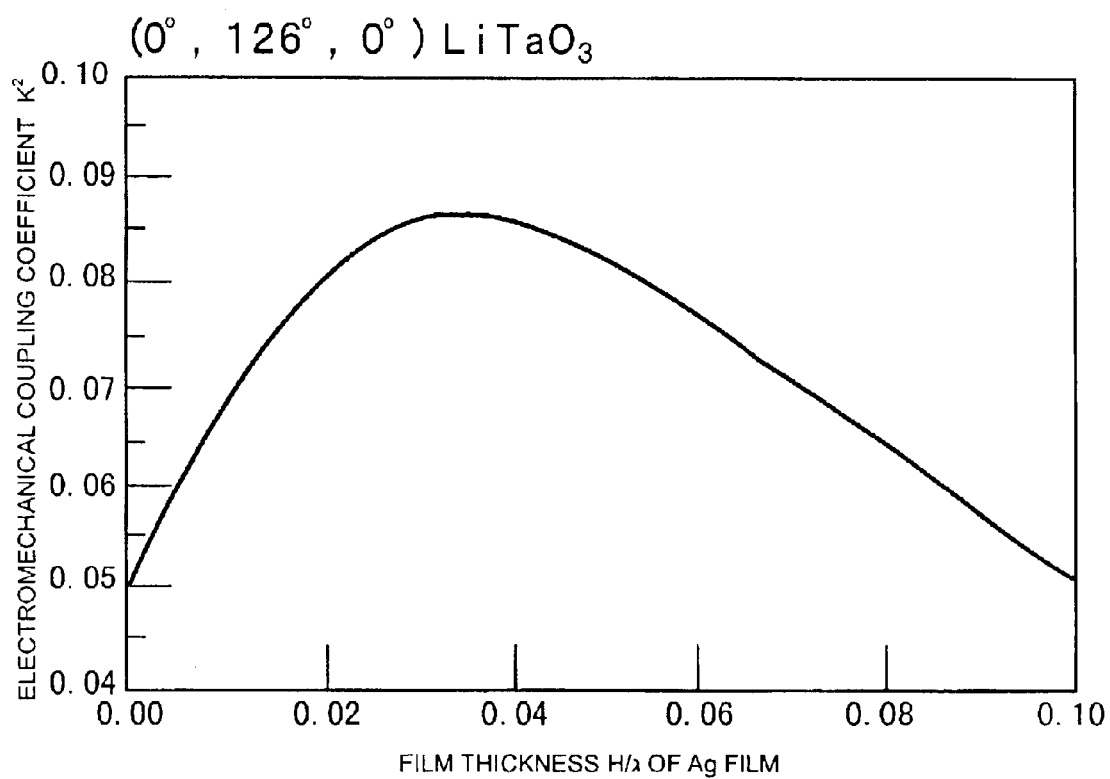
FIG. 4 is a diagram showing the relationship between the normalized film thickness H/λ of Ag film and the electromechanical coupling coefficient $K^2$ when electrodes made of Ag films having various film thicknesses are arranged on respective $LiTaO_3$ substrates having Euler angles (0°, 126°, 0°).

FIG. 4 shows the relationship between the normalized film thickness H/λ of an Ag film and the electromechanical coupling coefficient K$^2$ when an IDT made of Ag is arranged on a 36°-rotated Y plate X-propagating LiTaO$_3$ substrate (Euler angles (0°, 126°, 0°)). Here, λ denotes a wavelength at a center frequency of a surface acoustic wave device.

As is clear from FIG. 4, when the film thickness H/λ of the Ag film is within the range of about 0.01 to about 0.08, the electromechanical coupling coefficient K$^2$ is approximately 1.5 times or more than that in the case where no Ag film is arranged (H/λ=0), when the film thickness H/λ of the Ag film is within the range of about 0.02 to about 0.06, the electromechanical coupling coefficient K$^2$ takes on a value that is approximately 1.7 times or more than that in the case where no Ag film is arranged, and when the film thickness H/λ of the Ag film is within the range of about 0.03 to about 0.05, the electromechanical coupling coefficient K$^2$ takes on a value that is approximately 1.8 times or more than that in the case where no Ag film is arranged.

When the normalized film thickness H/λ of the Ag film exceeds about 0.08, manufacture of an IDT made of the Ag film becomes difficult. Consequently, in order that a large electromechanical coupling coefficient can be achieved, and the IDT is manufactured with ease, the thickness of the IDT made of the Ag film is desirably within the range of about 0.01 to about 0.08, more preferably, is specified to be within the range of about 0.02 to about 0.06, and further preferably, be within the range of about 0.03 to about 0.05.

Figure 5:
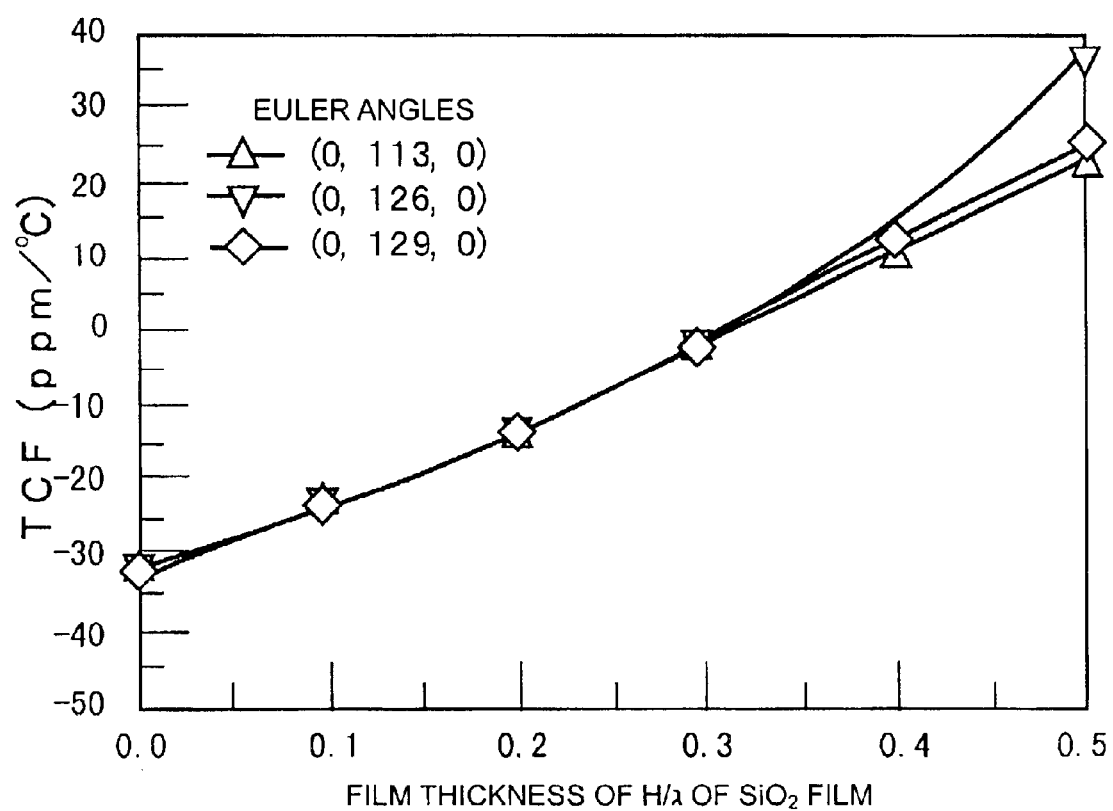
FIG. 5 is a diagram showing the relationship between the normalized film thickness H/λ of a $SiO_2$ film and the temperature coefficient of resonant frequency TCF when $SiO_2$ films having various film thicknesses are arranged on three types of $LiTaO_3$ substrate, each having Euler angles (0°, 113°, 0°), (0°, 126°, 0°), or (0°, 129°, 0°), while an electrode film thickness is 0.

Changes in the temperature coefficient of frequency TCF when a SiO$_2$ film is arranged on a LiTaO$_3$ substrate are shown in FIG. 5. FIG. 5 shows the relationship between the normalized film thickness H/λ of the SiO$_2$ film and the TCF when SiO$_2$ films are arranged on three types of LiTaO$_3$ substrates, each having Euler angles (0°, 113°, 0°), (0°, 126°, 0°), or (0°, 129°, 0°). No electrode is provided in this example.

As is clear from FIG. 5, in each of the cases where the θ is 113°, 126°, and 129°, the TCF falls within the range of −20 ppm/°C. to +17 ppm/°C. when the normalized film thickness H/λ of the SiO$_2$ film is within the range of about 0.15 to about 0.45. However, since film formation of the SiO$_2$ film takes much time, the film thickness H/λ of the SiO$_2$ film is desirably in the range of about 0.15 to about 0.40.

It has been known that the TCFs of the Rayleigh wave, etc., have been improved by arrangement of the SiO$_2$ film on the LiTaO$_3$ substrate. However, regarding a structure in which the electrode made of Ag is arranged on the LiTaO$_3$ substrate, and the SiO$_2$ film is further laminated, it is not reported that any actual experiment was performed in consideration of the thickness of the electrode made of Ag, the film thickness of the SiO$_2$, the cut angle, and the attenuation constant of the leaky elastic wave.

Figure 6:
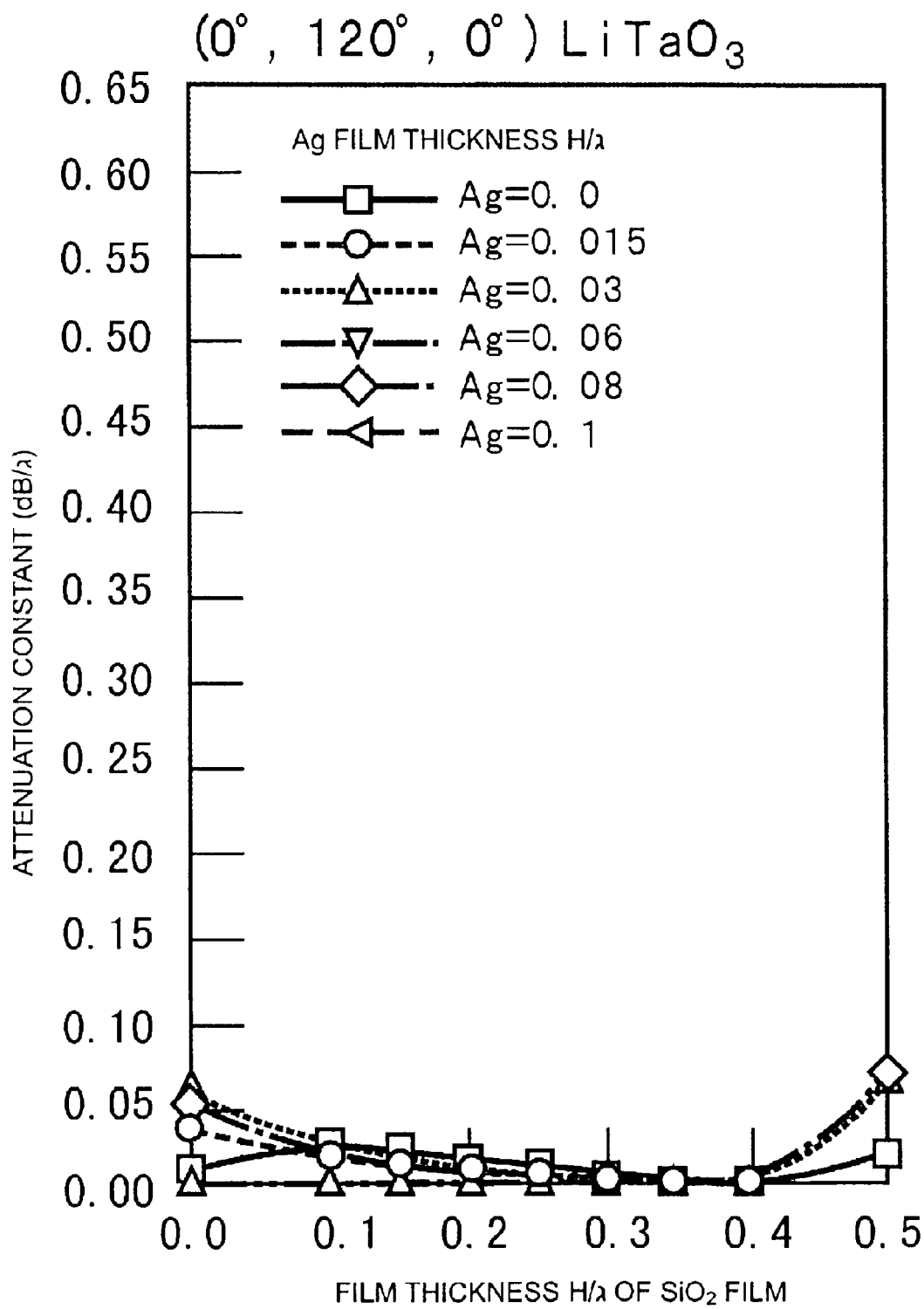
FIG. 6 is a diagram showing changes in the attenuation constant α when Ag films having normalized film thicknesses of about 0.1 or less are arranged on respective $LiTaO_3$ substrates having Euler angles (0°, 120°, 0°), and respective $SiO_2$ films having normalized film thicknesses of about 0 to about 0.5 are arranged.

FIG. 6 shows changes in the attenuation constant α when an electrode made of Ag having a normalized film thickness H/λ of about 0.10 or less and a SiO$_2$ film having a normalized film thickness H/λ of 0 to about 0.5 are arranged on a LiTaO$_3$ substrate having Euler angles (0°, 120°, 0°). As is clear from FIG. 6, when the film thickness H/λ of the SiO$_2$ film is about 0.2 to about 0.40, and the film thickness H/λ of the Ag film is about 0.01 to about 0.10, the attenuation constant α becomes small.

Figure 7:
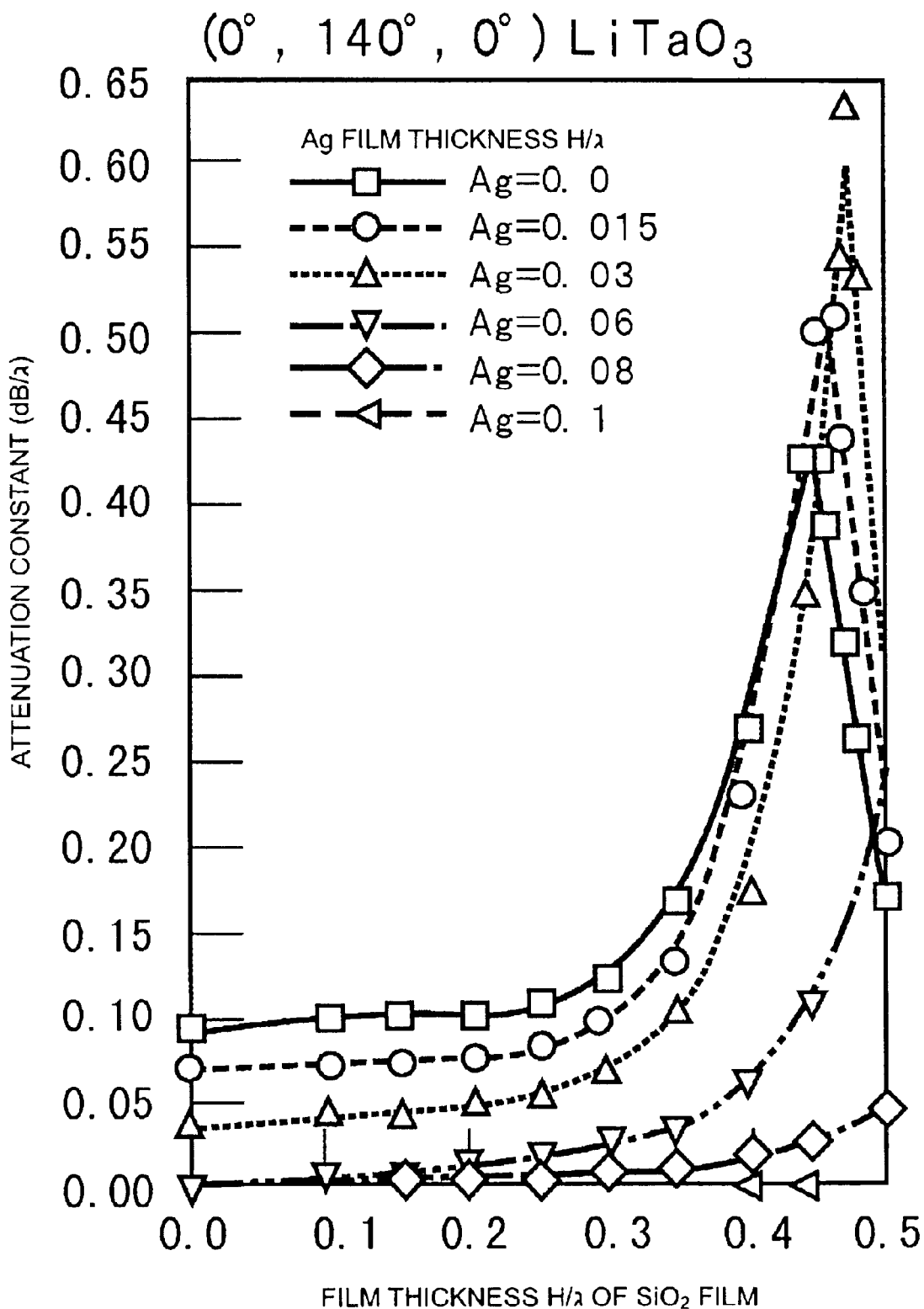
FIG. 7 is a diagram showing changes in the attenuation constant α when Ag films having normalized film thicknesses of about 0.1 or less are arranged on respective $LiTaO_3$ substrates having Euler angles (0°, 140°, 0°), and respective $SiO_2$ films having normalized film thicknesses of about 0 to about 0.5 are arranged.
Figure 8:
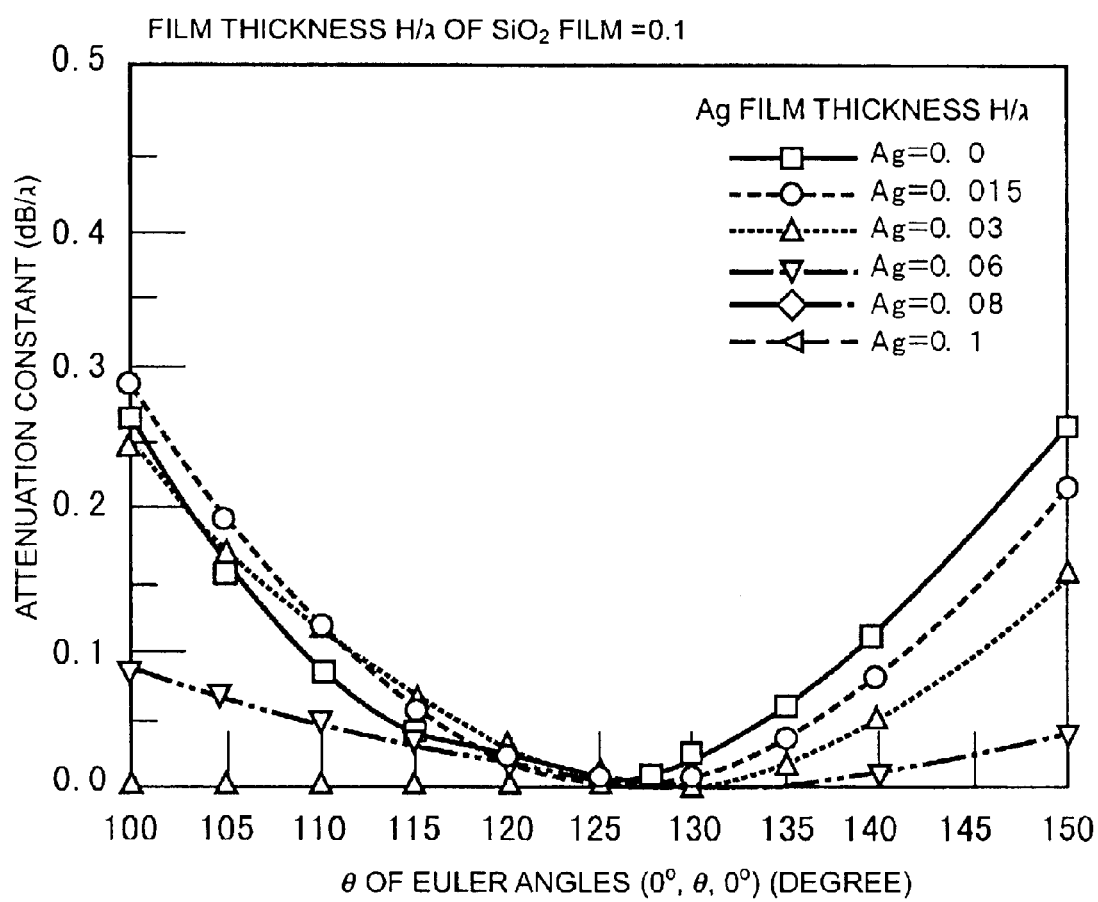
FIG. 8 is a diagram showing changes in the attenuation constant α when various Ag films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.1 are laminated.
Figure 9:
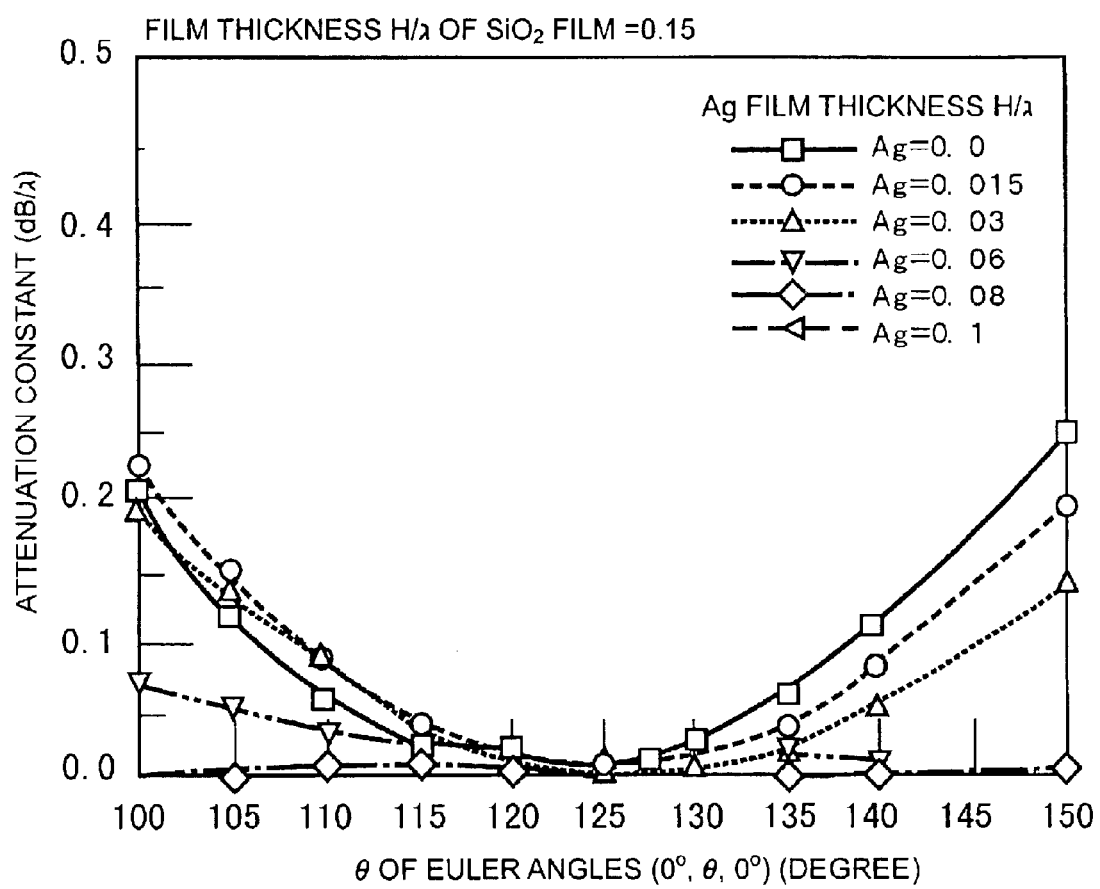
FIG. 9 is a diagram showing changes in the attenuation constant α when various Ag films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.15 are laminated.
Figure 10:
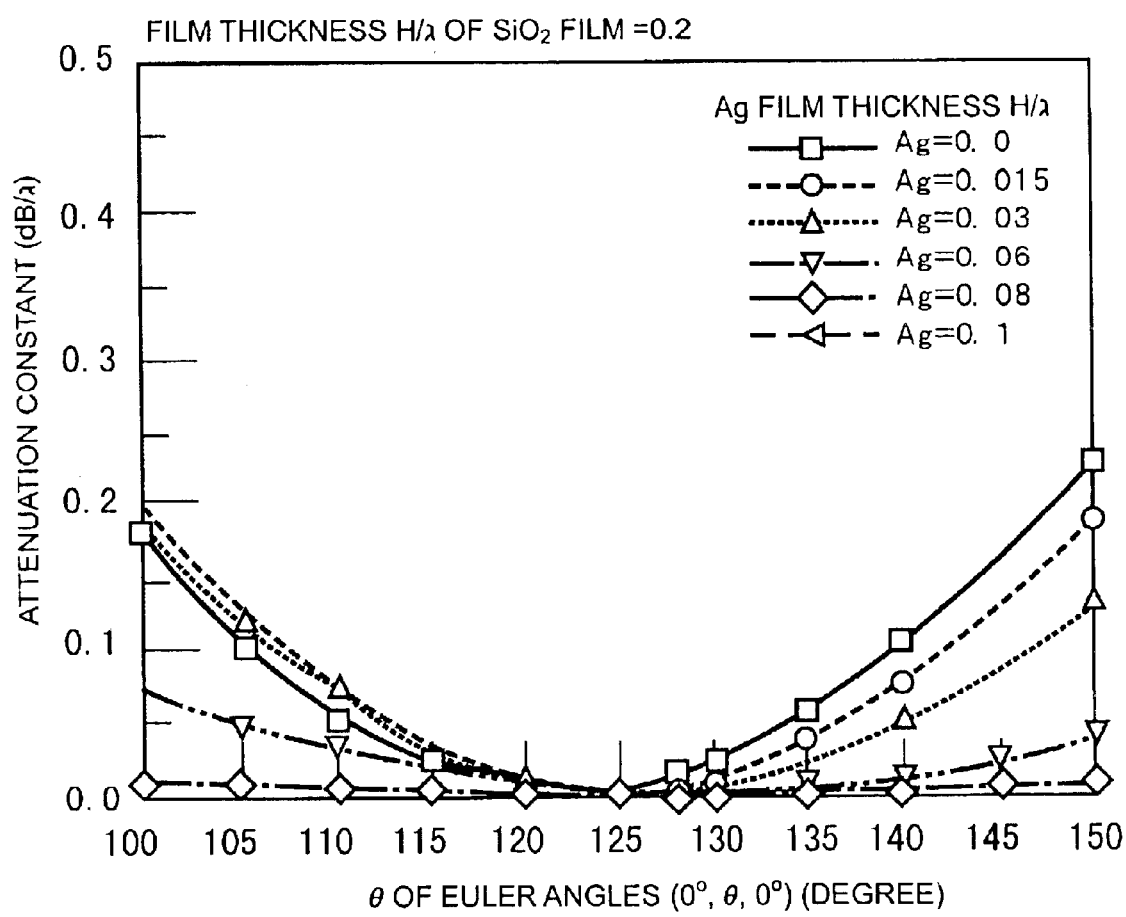
FIG. 10 is a diagram showing changes in the attenuation constant α when various Ag films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.2 are laminated.
Figure 11:
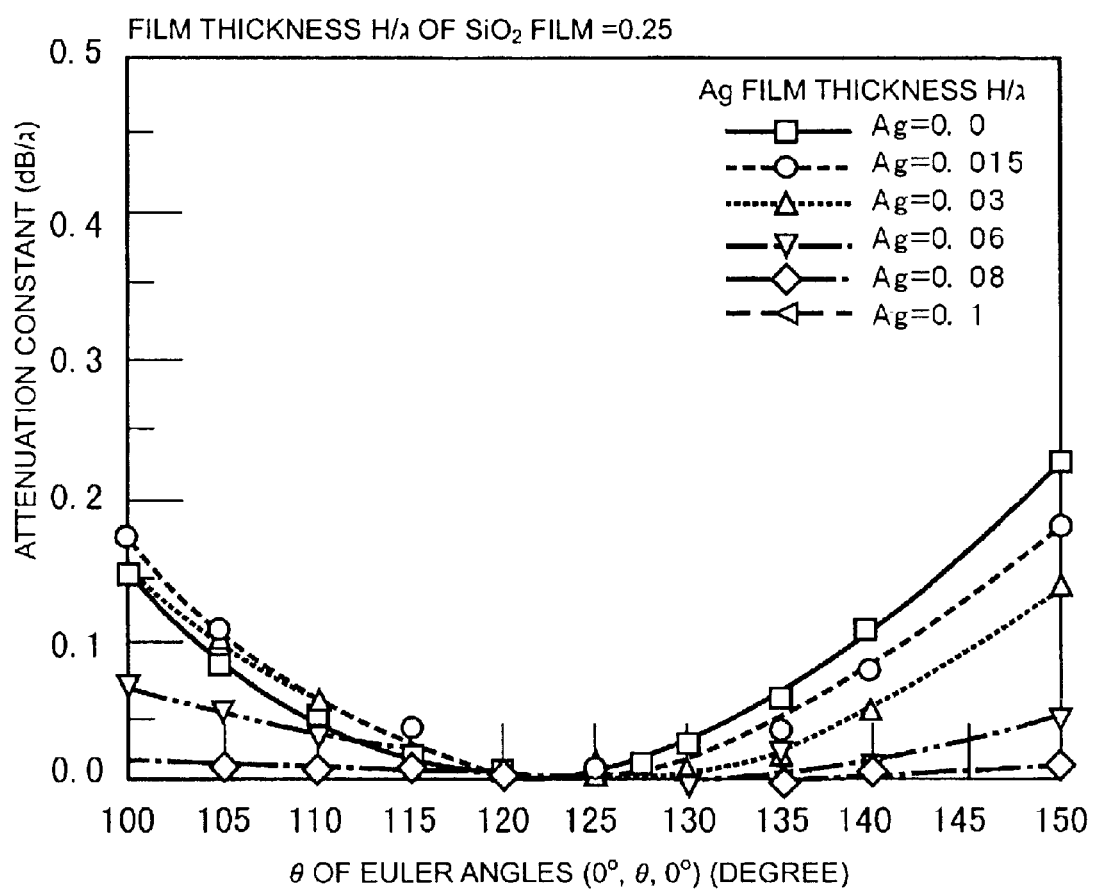
FIG. 11 is a diagram showing changes in the attenuation constant α when various Ag films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.25 are laminated.
Figure 12:
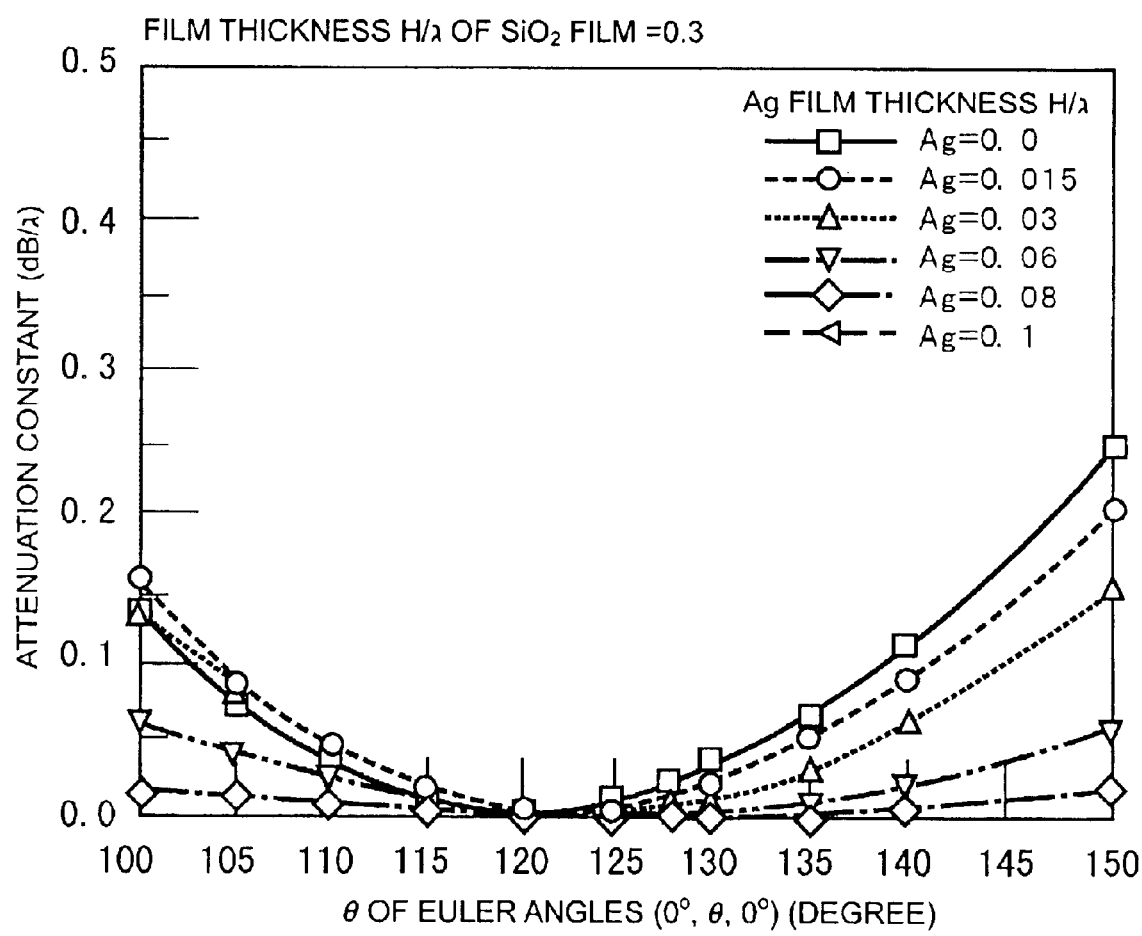
FIG. 12 is a diagram showing changes in the attenuation constant α when various Ag films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.3 are laminated.
Figure 13:
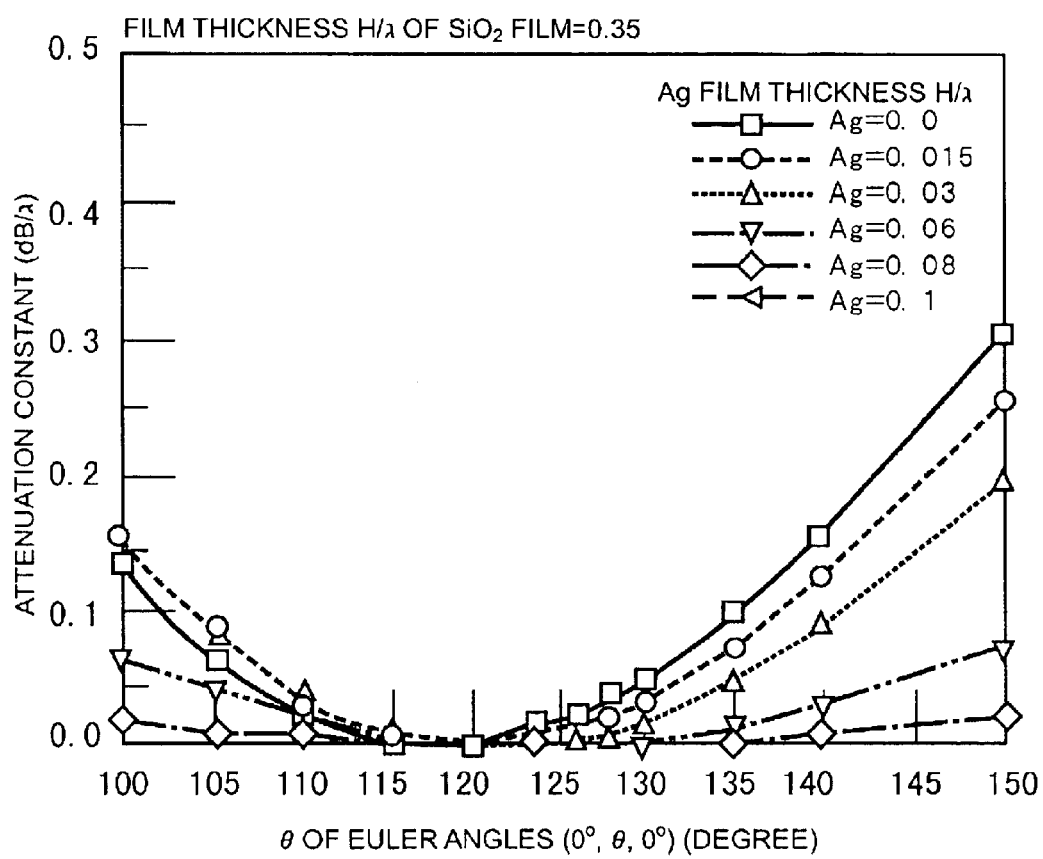
FIG. 13 is a diagram showing changes in the attenuation constant α when various Ag films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.35 are laminated.
Figure 14:
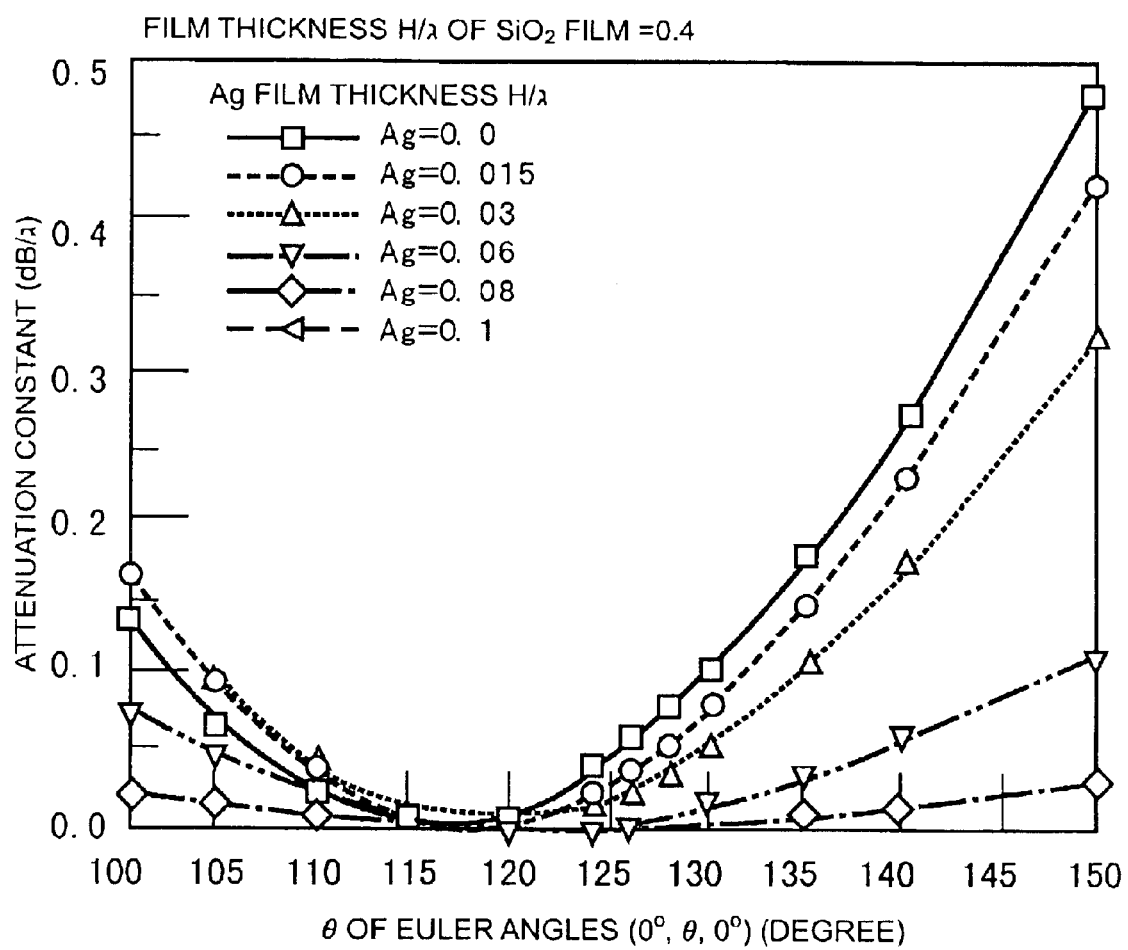
FIG. 14 is a diagram showing changes in the attenuation constant α when various Ag films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.4 are laminated.
Figure 15:
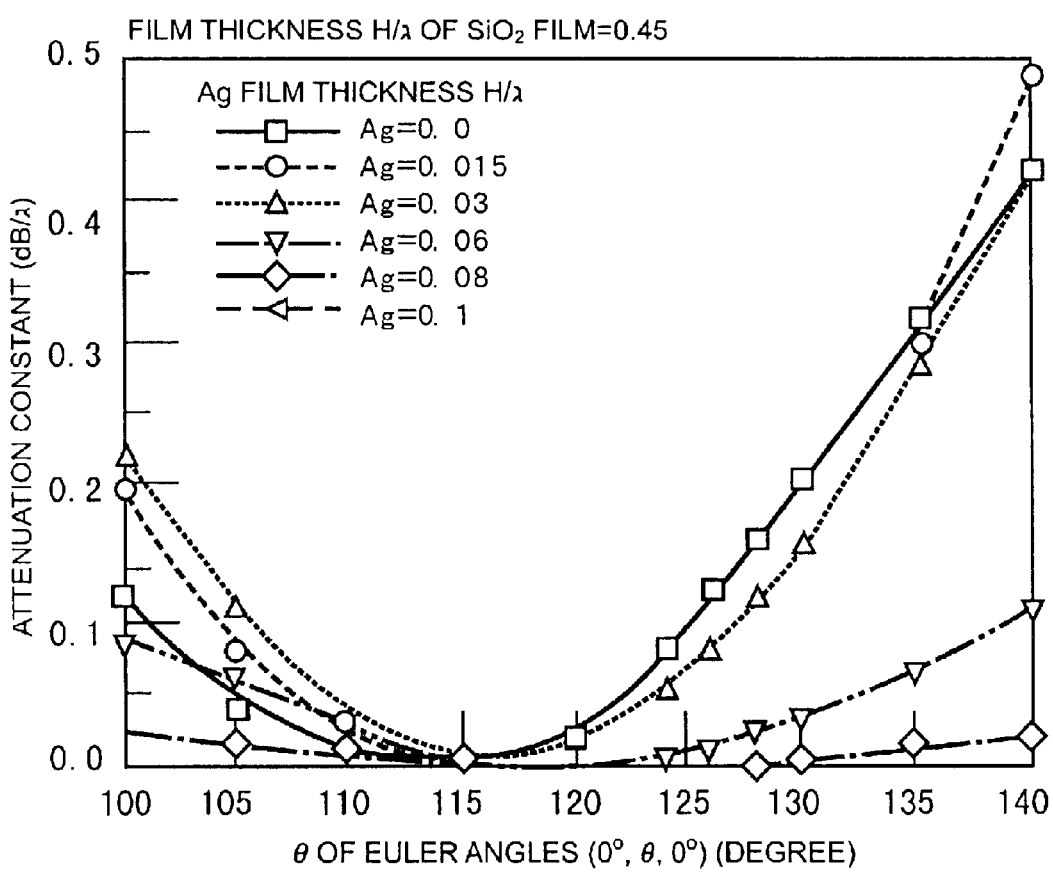
FIG. 15 is a diagram showing changes in the attenuation constant α when various Ag films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.45 are laminated.
Figure 16A:
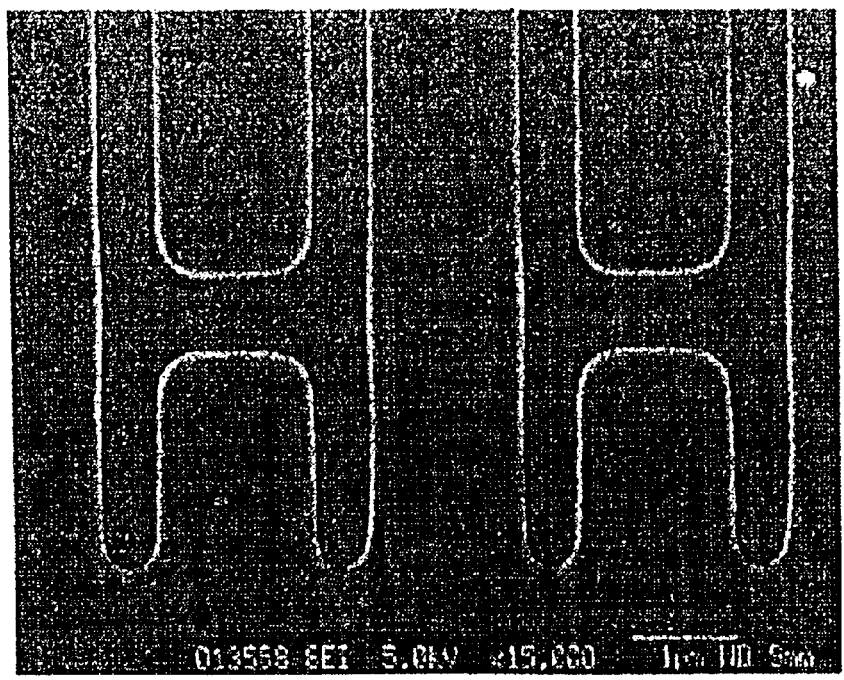
FIGS. 16A and 16B are scanning electron micrographs for explaining problems in a conventional surface acoustic wave device where
Figure 16B:

On the other hand, FIG. 7 shows changes in the attenuation constant α when an Ag film having a normalized film thickness H/λ of about 0 to about 0.10 is arranged on a LiTaO$_3$ substrate having Euler angles (0°, 140°, 0°), and a SiO$_2$ film having a normalized film thickness H/λ of about 0 to about 0.5 is further arranged.

As is clear from FIG. 7, in the case where the LiTaO$_3$ substrate having the θ of 140° is used, even when the film thickness of the SiO$_2$ film is changed as described above while the film thickness of the Ag film is about 0.06 or less, the attenuation constants a are large.

Consequently, it is clear that in order to realize an excellent TCF, large electromechanical coupling coefficient, and small attenuation constant, the cut angle of the LiTaO$_3$ substrate, that is, the Euler angles, the film thickness of the SiO$_2$ film, and the film thickness of the electrode made of Ag must be combined while each of them is adjusted to be optimum.

Each of FIGS. 8 to 15 shows the relationship between the θ and the attenuation constant α when an Ag film having a normalized film thickness H/λ of about 0.1 or less is arranged on a LiTaO$_3$ substrate while the normalized film thickness H/λ of a SiO$_2$ film is approximately 0.1, 0.15, 0.2, 0.25, 0.3, 0.35, 0.4 or 0.45.

As is clear from FIGS. 8 to 15, in the case where the thickness H/λ of the Ag film is with the range of about 0.01 to about 0.08, when the thickness of the SiO$_2$ film and the θ of the Euler angles are chosen in order to satisfy (a) to (f) shown in the following Table 2, the frequency temperature characteristic TCF becomes excellent, the electromechanical coupling coefficient is increased, and the attenuation constant α can be effectively controlled. Desirably, further excellent characteristics can be attained when more preferable Euler angles shown in the right column of the following Table 2 are chosen.

TABLE 2

Ag film thickness H/λ: about 0.01 to about 0.08

|     | SiO$_2$ film thickness | Euler angles of LiTaO$_3$ | More preferable Euler angles |
|-----|------------|------------------|------------------|
| (a) | 0.15 to 0.18 | 0, 117 to 137, 0 | 0, 120 to 135, 0 |
| (b) | 0.18 to 0.23 | 0, 117 to 136, 0 | 0, 118 to 133, 0 |
| (c) | 0.23 to 0.28 | 0, 115 to 135, 0 | 0, 117 to 133, 0 |
| (d) | 0.28 to 0.33 | 0, 113 to 133, 0 | 0, 115 to 132, 0 |
| (e) | 0.33 to 0.38 | 0, 113 to 135, 0 | 0, 115 to 133, 0 |
| (f) | 0.38 to 0.40 | 0, 113 to 132, 0 | 0, 115 to 130, 0 |

More preferably, in the case where the normalized thickness H/λ of the Ag film is about 0.02 to about 0.06, when the thickness of the SiO$_2$ film and the θ of the Euler angles are chosen in order to satisfy (g) to (l) shown in the following Table 3, more preferable characteristics can be attained. Desirably, further excellent characteristics can be attained when more preferable Euler angles shown in the right column of the following Table 3 are chosen.

TABLE 3

Ag film thickness H/λ: about 0.02 to about 0.06

|     | SiO$_2$ film thickness | Euler angles of LiTaO$_3$ | More preferable Euler angles |
|-----|------------|------------------|------------------|
| (g) | 0.15 to 0.18 | 0, 120 to 133, 0 | 0, 122 to 130, 0 |
| (h) | 0.18 to 0.23 | 0, 120 to 137, 0 | 0, 122 to 136, 0 |
| (i) | 0.23 to 0.28 | 0, 120 to 135, 0 | 0, 122 to 133, 0 |
| (j) | 0.28 to 0.33 | 0, 118 to 135, 0 | 0, 120 to 133, 0 |
| (k) | 0.33 to 0.38 | 0, 115 to 133, 0 | 0, 117 to 130, 0 |
| (l) | 0.38 to 0.40 | 0, 113 to 130, 0 | 0, 115 to 128, 0 |

Further preferably, in the case where the normalized thickness of the Ag film is about 0.03 to about 0.05, when the thickness of the SiO$_2$ film and the θ of the Euler angles are chosen in order to satisfy (m) to (r) shown in the following Table 4, further excellent characteristics can be attained. In this case as well, the characteristics can be further improved when more preferable Euler angles shown in the right column of the following Table 4 are chosen.

TABLE 4

Ag film thickness H/λ: about 0.03 to about 0.05

|     | SiO$_2$ film thickness | Euler angles of LiTaO$_3$ | More preferable Euler angles |
|-----|------------|------------------|------------------|
| (m) | 0.15 to 0.18 | 0, 122 to 142, 0 | 0, 123 to 140, 0 |
| (n) | 0.18 to 0.23 | 0, 120 to 140, 0 | 0, 122 to 137, 0 |

TABLE 4-continued

Ag film thickness H/λ: about 0.03 to about 0.05

|     | SiO$_2$ film thickness | Euler angles of LiTaO$_3$ | More preferable Euler angles |
|-----|------------|------------------|------------------|
| (o) | 0.23 to 0.28 | 0, 117 to 138, 0 | 0, 120 to 135, 0 |
| (p) | 0.28 to 0.33 | 0, 116 to 136, 0 | 0, 118 to 134, 0 |
| (q) | 0.33 to 0.38 | 0, 114 to 135, 0 | 0, 117 to 133, 0 |
| (r) | 0.38 to 0.40 | 0, 113 to 130, 0 | 0, 115 to 128, 0 |

In preferred embodiments of the present invention, the IDT may include Ag alone, or include an Ag alloy or a laminate of Ag and other metal as long as Ag is primarily included. The IDT primarily containing Ag essentially includes approximately 80% by weight or more of Ag relative to the total IDT. Consequently, an Al thin film or Ti thin film may be arranged as the substrate of Al, and in this case, it is also preferable that Ag includes approximately 80% by weight or more of the total of the substrate thin film and Ag.

In the aforementioned experiment, the LiTaO$_3$ substrate having Euler angles (0°, θ, 0°) was used. In general, variations of 0±3° occur regarding the Euler angles of the substrate material. However, the effects of preferred embodiments of the present invention can be achieved even within the range of such variations, that is, regarding the LiTaO$_3$ substrate of (0±3, 110° to 150°, 0±3°).

The present invention can be applied to not only the longitudinally coupled resonator type surface acoustic wave filter shown in FIG. 1, but also various surface acoustic wave devices, for example, surface acoustic wave resonators, transversely coupled surface acoustic wave filters, ladder filters, and lattice filters.

In the surface acoustic wave device according to preferred embodiments of the present invention, since at least one IDT primarily including Ag is arranged on the LiTaO$_3$ substrate having Euler angles (0±3°, 110° to 150°, 0±3°), and the SiO$_2$ film is arranged on the LiTaO$_3$ substrate to cover the IDT, the surface acoustic wave device having a large electromechanical coupling coefficient, excellent temperature characteristics, a reduced attenuation constant α, and a reduced propagation loss can be provided.

In preferred embodiments of the present invention, when the film thickness normalized by the wavelength of the surface acoustic wave of the IDT is within the range of about 0.01 to about 0.08, and the normalized film thickness of the SiO$_2$ film is within the range of about 0.15 to about 0.40, the electromechanical coupling coefficient can be further increased, and excellent temperature characteristics can be realized.

Furthermore, when the film thickness H/λ of the IDT is about 0.01 to about 0.08, and the θ of the Euler angles of the LiTaO$_3$ substrate and the normalized film thickness H/λ of the SiO$_2$ film are chosen as indicated by (a) to (f) shown in Table 5, the surface acoustic wave device having a larger electromechanical coupling coefficient, further reduced attenuation constant α, and further excellent frequency temperature characteristic can be provided.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:

a LiTaO$_3$ substrate having Euler angles (0±3°, 110° to 150°, 0±3°);

at least one IDT disposed on the LiTaO$_3$ substrate and which primarily includes Ag; and a SiO$_2$ film arranged on the LiTaO$_3$ substrate so as to cover the at least one IDT; wherein the film thickness H/λ (H represents a film thickness and λ represents a wavelength of a surface acoustic wave) of the IDT is within the range of about 0.01 to about 0.08, and the combination of the normalized film thickness of the SiO$_2$ and the Euler angles of the LiTaO$_3$ substrate is any one of those indicated by (a) to (f) in the following Table:

|  | SiO$_2$ film thickness | Euler angles of LiTaO$_3$ (°) |
| --- | --- | --- |
| (a) | 0.15 to 0.18 | 0 ± 3, 113 to 150, 0 ± 3 |
| (b) | 0.18 to 0.23 | 0 ± 3, 115 to 145, 0 ± 3 |
| (c) | 0.23 to 0.28 | 0 ± 3, 115 to 145, 0 ± 3 |
| (d) | 0.28 to 0.33 | 0 ± 3, 114 to 143, 0 ± 3 |
| (e) | 0.33 to 0.38 | 0 ± 3, 112 to 142, 0 ± 3 |
| (f) | 0.38 to 0.40 | 0 ± 3, 110 to 140, 0 ± 3. |

2. The surface acoustic wave device according to claim 1, wherein a leaky surface acoustic wave primarily including a shear horizontal wave is used as the surface acoustic wave.

3. The surface acoustic wave device according to claim 1, further comprising a pair of the IDTs disposed on the substrate.

4. The surface acoustic wave device according to claim 3, further comprising a pair of reflectors disposed on the substrate outside of the pair of IDTs.

5. The surface acoustic wave device according to claim 4, wherein the pair of IDTs and the pair of reflectors are made of Ag.

6. The surface acoustic wave device according to claim 1, further comprising at least one reflector disposed on the substrate.

7. The surface acoustic wave device according to claim 1, wherein the at least one IDT is made of only Ag.

8. The surface acoustic wave device according to claim 1, wherein the at least one IDT is made of one of Ag, an Ag alloy and a laminate of Ag and another metal.

9. A surface acoustic wave device comprising:

a LiTaO$_3$ substrate having Euler angles (0±3°, 110° to 150°, 0±3°)

at least one IDT disposed on the LiTaO$_3$ substrate and which primarily includes Ag; and a SiO$_2$ film arranged on the LiTaO$_3$ substrate so as to cover the at least one IDT; wherein the film thickness H/λ (H represents a film thickness and λ represents a wavelength of a surface acoustic wave) of the IDT is within the range of about 0.02 to about 0.06, and the combination of the normalized film thickness of the SiO$_2$ and the Euler angles of the LiTaO$_3$ substrate is any one of those indicated by (g) to (l) in the following Table:

|  | SiO$_2$ film thickness | Euler angles of LiTaO$_3$ (°) |
| --- | --- | --- |
| (g) | 0.15 to 0.18 | 0, 120 to 133, 0 |
| (h) | 0.18 to 0.23 | 0, 120 to 137, 0 |
| (i) | 0.23 to 0.28 | 0, 120 to 135, 0 |
| (j) | 0.28 to 0.33 | 0, 118 to 135, 0 |
| (k) | 0.33 to 0.38 | 0, 115 to 133, 0 |
| (l) | 0.38 to 0.40 | 0, 113 to 130, 0 |

10. The surface acoustic wave device according to claim 9, wherein a leaky surface acoustic wave primarily including a shear horizontal wave is used as the surface acoustic wave.

11. The surface acoustic wave device according to claim 9, further comprising a pair of the IDTs disposed on the substrate.

12. The surface acoustic wave device according to claim 11, further comprising a pair of reflectors disposed on the substrate outside of the pair of IDTs.

13. The surface acoustic wave device according to claim 12, wherein the pair of IDTs and the pair of reflectors are made of Ag.

14. The surface acoustic wave device according to claim 9, further comprising at least one reflector disposed on the substrate.

15. The surface acoustic wave device according to claim 9, wherein the at least one IDT is made of only Ag.

16. The surface acoustic wave device according to claim 9, wherein the at least one IDT is made of one of Ag, an Ag alloy and a laminate of Ag and another metal.

17. A surface acoustic wave device comprising:

a LiTaO$_3$ substrate having Euler angles (0±3°, 110° to 150°, 0±3°);

at least one IDT disposed on the LiTaO$_3$ substrate and which primarily includes Ag; and a SiO$_2$ film arranged on the LiTaO$_3$ substrate so as to cover the at least one IDT; wherein the film thickness H/λ (H represents a film thickness and λ represents a wavelength of a surface acoustic wave) of the IDT is within the range of about 0.03 to about 0.05, and the combination of the normalized film thickness of the SiO$_2$ and the Euler angles of the LiTaO$_3$ substrate is any one of those indicated by (m) to (r) in the following Table:

|  | SiO$_2$ film thickness | Euler angles of LiTaO$_3$ (°) |
| --- | --- | --- |
| (m) | 0.15 to 0.18 | 0, 122 to 142, 0 |
| (n) | 0.18 to 0.23 | 0, 120 to 140, 0 |
| (o) | 0.23 to 0.28 | 0, 117 to 138, 0 |
| (p) | 0.28 to 0.33 | 0, 116 to 136, 0 |
| (q) | 0.33 to 0.38 | 0, 114 to 135, 0 |
| (r) | 0.38 to 0.40 | 0, 113 to 130, 0 |

18. The surface acoustic wave device according to claim 17, wherein a leaky surface acoustic wave primarily including a shear horizontal wave is used as the surface acoustic wave.

19. The surface acoustic wave device according to claim 17, further comprising a pair of the IDTs disposed on the substrate.

20. The surface acoustic wave device according to claim 19, further comprising a pair of reflectors disposed on the substrate outside of the pair of IDTs.

21. The surface acoustic wave device according to claim 20, wherein the pair of IDTs and the pair of reflectors are made of Ag.

22. The surface acoustic wave device according to claim 17, further comprising at least one reflector disposed on the substrate.

23. The surface acoustic wave device according to claim 17, wherein the at least one IDT is made of only Ag.

24. The surface acoustic wave device according to claim 17, wherein the at least one IDT is made of one of Ag, an Ag alloy and a laminate of Ag and another metal.

25. A surface acoustic wave device comprising:
a LiTaO$_3$ substrate having Euler angles (0±3°, 110° to 150°, 0±3°);
at least one IDT disposed on the LiTaO$_3$ substrate and which primarily includes Ag; and
a SiO$_2$ film arranged on the LiTaO$_3$ substrate so as to cover the at least one IDT; wherein
the film thickness H/λ (H represents a film thickness and λ represents a wavelength of a surface acoustic wave) of the IDT is within the range of about 0.02 to about 0.06, and the combination of the normalized film thickness of the SiO$_2$ and the Euler angles of the LiTaO$_3$ substrate is any one of those indicated by (g') to (l') in the following Table:

|  | SiO$_2$ film thickness | Euler angles of LiTaO$_3$ (°) |
|---|---|---|
| (g') | 0.15 to 0.18 | 0, 122 to 130, 0 |
| (h') | 0.18 to 0.23 | 0, 122 to 136, 0 |
| (i') | 0.23 to 0.28 | 0, 122 to 133, 0 |
| (j') | 0.28 to 0.33 | 0, 120 to 133, 0 |
| (k') | 0.33 to 0.38 | 0, 117 to 130, 0 |
| (l') | 0.38 to 0.40 | 0, 115 to 128, 0 |

26. The surface acoustic wave device according to claim 25, wherein a leaky surface acoustic wave primarily including a shear horizontal wave is used as the surface acoustic wave.

27. The surface acoustic wave device according to claim 25, further comprising a pair of the IDTs disposed on the substrate.

28. The surface acoustic wave device according to claim 27, further comprising a pair of reflectors disposed on the substrate outside of the pair of IDTs.

29. The surface acoustic wave device according to claim 28, wherein the pair of IDTs and the pair of reflectors are made of Ag.

30. The surface acoustic wave device according to claim 25, further comprising at least one reflector disposed on the substrate.

31. The surface acoustic wave device according to claim 27, wherein the at least one IDT is made of only Ag.

32. The surface acoustic wave device according to claim 25, wherein the at least one IDT is made of one of Ag, an Ag alloy and a laminate of Ag and another metal.

33. A surface acoustic wave device comprising:
a LiTaO$_3$ substrate having Euler angles (0±3°, 110° to 150°, 0±3°);
at least one IDT disposed on the LiTaO$_3$ substrate and which primarily includes Ag; and
a SiO$_2$ film arranged on the LiTaO$_3$ substrate so as to cover the at least one IDT; wherein
the film thickness H/λ (H represents a film thickness and λ represents a wavelength of a surface acoustic wave) of the IDT is within the range of about 0.03 to about 0.05, and the combination of the normalized film thickness of the SiO$_2$ and the Euler angles of the LiTaO$_3$ substrate is any one of those indicated by (m') to (r') in the following Table:

|  | SiO$_2$ film thickness | Euler angles of LiTaO$_3$ (°) |
|---|---|---|
| (m') | 0.15 to 0.18 | 0, 123 to 140, 0 |
| (n') | 0.18 to 0.23 | 0, 122 to 137, 0 |
| (o') | 0.23 to 0.28 | 0, 120 to 135, 0 |
| (p') | 0.28 to 0.33 | 0, 118 to 134, 0 |
| (q') | 0.33 to 0.38 | 0, 117 to 133, 0 |
| (r') | 0.38 to 0.40 | 0, 115 to 128, 0 |

34. The surface acoustic wave device according to claim 33, wherein a leaky surface acoustic wave primarily including a shear horizontal wave is used as the surface acoustic wave.

35. The surface acoustic wave device according to claim 33, further comprising a pair of the IDTs disposed on the substrate.

36. The surface acoustic wave device according to claim 35, further comprising a pair of reflectors disposed on the substrate outside of the pair of IDTs.

37. The surface acoustic wave device according to claim 36, wherein the pair of IDTs and the pair of reflectors are made of Ag.

38. The surface acoustic wave device according to claim 33, further comprising at least one reflector disposed on the substrate.

39. The surface acoustic wave device according to claim 33, wherein the at least one IDT is made of only Ag.

40. The surface acoustic wave device according to claim 33, wherein the at least one IDT is made of one of Ag, an Ag alloy and a laminate of Ag and another metal.

* * * * *